United States Patent
Schmitkons et al.

[11] Patent Number: 5,733,597
[45] Date of Patent: Mar. 31, 1998

[54] SNUFF BACK CONTROLLED COATING DISPENSING APPARATUS AND METHODS

[75] Inventors: James W. Schmitkons, Lorain; James Turner, Amherst; Marcus P. Zupan, Avon Lake; Antonio Rivas, Lorain, all of Ohio; Jurgen Benecke, Luneburg, Germany; Arthur Cieplik, Luneburg, Germany; Thomas Burmester, Bleckede, Germany; Bentley Boger, Atlanta, Ga.

[73] Assignee: Nordson Corporation, Westlake, Ohio

[21] Appl. No.: 415,614

[22] Filed: Apr. 3, 1995

Related U.S. Application Data

[63] Continuation of Ser. No. 280,362, Jul. 26, 1994, abandoned, which is a continuation-in-part of Ser. No. 259,818, Jun. 15, 1994, Pat. No. 5,409,733, which is a continuation of Ser. No. 910,782, Jul. 8, 1992, abandoned.

[51] Int. Cl.⁶ .................... B05D 5/00; B05C 5/00
[52] U.S. Cl. ............ 427/96; 427/287; 427/420; 427/424; 118/324
[58] Field of Search ............. 427/420, 96, 287, 427/424; 118/324, 315

[56] References Cited

U.S. PATENT DOCUMENTS

| | | | |
|---|---|---|---|
| 3,315,899 | 4/1967 | Quarve. | |
| 3,895,748 | 7/1975 | Klingenberg | 222/571 |
| 3,999,691 | 12/1976 | Doom | 222/330 |
| 4,004,717 | 1/1977 | Wanke | 222/255 |
| 4,053,012 | 10/1977 | Farmer | 164/254 |
| 4,124,163 | 11/1978 | Siegmann | 239/583 |
| 4,128,667 | 12/1978 | Timson | 427/420 |
| 4,142,707 | 3/1979 | Bjorklund | 251/77 |
| 4,660,598 | 4/1987 | Butterfield et al. | 137/510 |
| 4,753,819 | 6/1988 | Shimada | 427/96 |
| 4,938,994 | 7/1990 | Choinski | 427/420 |
| 5,078,168 | 1/1992 | Konieczynski | 137/566 |
| 5,141,165 | 8/1992 | Sharpless et al. | 239/752 |
| 5,188,669 | 2/1993 | Donges et al. | 118/503 |
| 5,217,169 | 6/1993 | Faulkner, III et al. | 239/562 |
| 5,409,733 | 4/1995 | Boger et al. | 427/96 |
| 5,516,545 | 5/1996 | Sandock | 427/76 |

FOREIGN PATENT DOCUMENTS

| | | | |
|---|---|---|---|
| 91/12088 | 8/1991 | WIPO | 427/421 |
| 91/18682 | 12/1991 | WIPO | 427/421 |

*Primary Examiner*—Katherine A. Bareford
*Attorney, Agent, or Firm*—Wood, Herron & Evans, L.L.P.

[57] ABSTRACT

Coating dispenser apparatus and methods which utilize a snuff back device for removing a small amount of coating material from the discharge passage of the dispenser upon shut-off thereof at the end of a coating run. A control is provided which discharges the material removed from the discharge passage back into the discharge passage upon a predetermined delay after the start of the next coating run. The disclosed methods contemplate the discharge of coating material back into the discharge passage in the middle of the next coating pattern, or depending on the application, during any segment of the next coating pattern after a defined leading edge of the pattern is created, during which segment the coating material discharged back into the discharge pattern smoothly blends into the coating pattern as it is applied to a substrate. The apparatus and methods are especially useful for applying conformal coating patterns onto circuit boards.

18 Claims, 2 Drawing Sheets

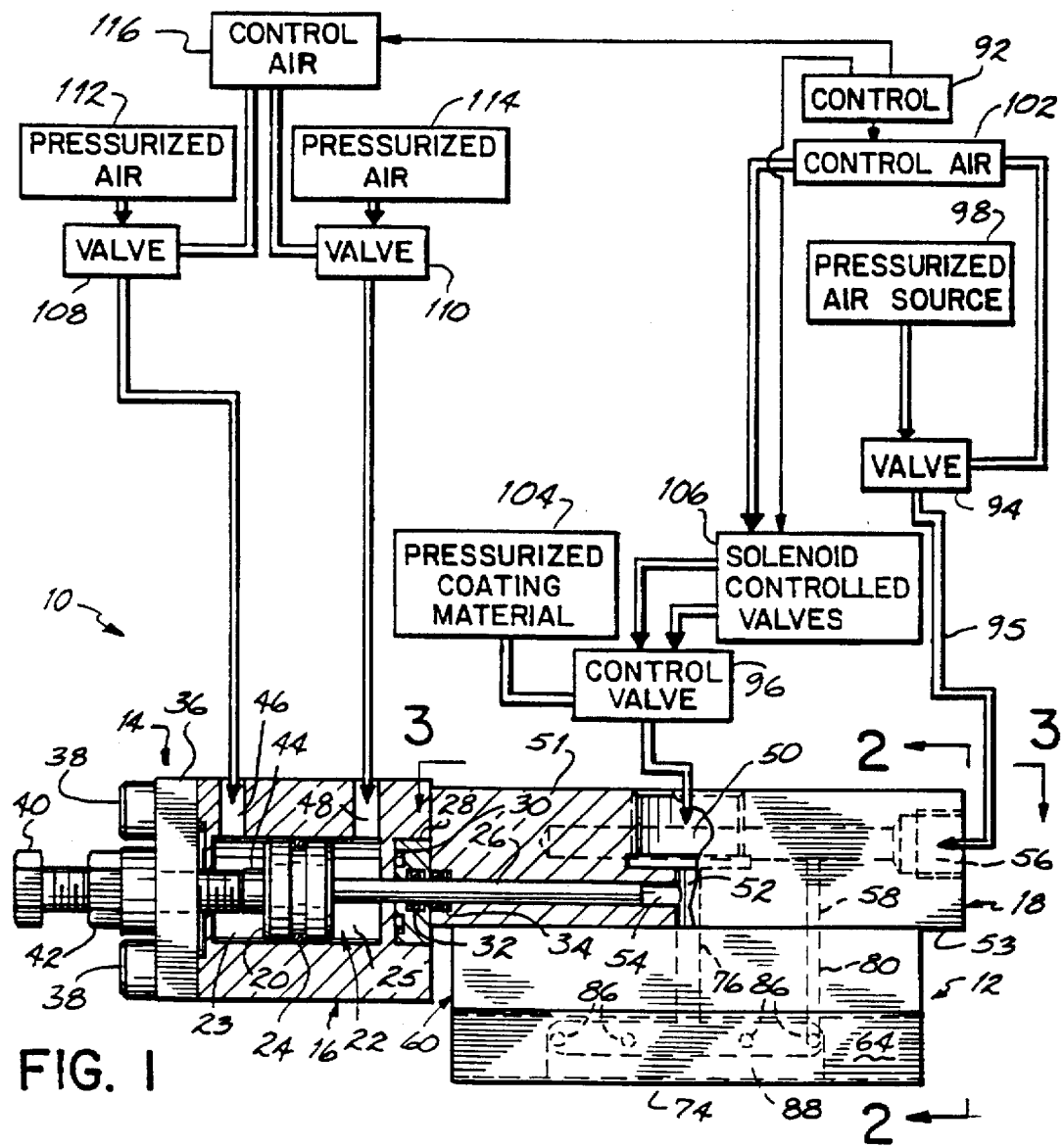

SNUFF BACK CONTROLLED COATING DISPENSING APPARATUS AND METHODS

This case is a continuation of application Ser. No. 08/280,362, filed Jul. 26, 1994, now abandoned, which is a continuation-in-part of U.S. patent application Ser. No. 08/259,818 filed on Jun. 15, 1994 entitled "APPARATUS AND METHODS FOR APPLYING CONFORMAL COATINGS TO ELECTRONIC CIRCUIT BOARDS", now U.S. Pat. No. 5,409,733, which is a continuation of U.S. patent application Ser. No. 07/910,782 filed on Jul. 8, 1992 entitled "APPARATUS AND METHODS FOR APPLYING CONFORMAL COATINGS TO ELECTRONIC CIRCUIT BOARDS", now abandoned. The disclosures of Application Ser. Nos. 08/259,818 and 07/910,782 are hereby expressly incorporated herein by reference in their entirety.

BACKGROUND OF THE INVENTION

This invention generally relates to the application of coating materials onto substrates and, more specifically, the application of moistureproof, insulating coating films to electronic circuit boards and hot melt materials onto various substrates. The term coating material as used herein includes hot melt adhesive materials. Apparatus and methods are disclosed for carrying out such coatings by application of discrete uniform coatings having sharp, square, cut-on and cut-off edges.

Many industrial applications require the use of discrete, well defined and uniform coatings applied to predetermined areas. Such coatings are very useful in varied processes, such as conformal coatings on non-uniform or irregular substrates like electronic circuit boards. In the production of discrete coatings for application to discrete substrate areas, for example, it is desirable to obtain broad, uniform coatings in a non-contact application process with sharp, square, cut-on and cut-off edges with no stringing of material. None of the processes currently known are entirely suitable for this application.

In the manufacture of printed circuit boards, a moistureproof insulator film is applied to protect the circuit boards from moisture, electric leakage and dust. The moistureproof insulator films are known as conformal coatings, and include materials such as acrylic, polyurethane, or epoxy synthetic resins dissolved in a volatile solvent, silicones and 100% solids materials. One conformal coating found satisfactory is available from HumiSeal Division, Columbia Chase Corp., Woodside, N.Y., under the trademark "HumiSeal 1 B31". When applied to clean printed circuit boards, an insulative resin film of uniform thickness, is formed without pinholes from this material as the solvent evaporates on a continuous basis. Other materials can also be suitable.

As mentioned in the above-incorporated U.S. patent applications Ser. Nos. 07/910,782 and 08/259,818 (the '782 and '818 applications) spraying methods of application are advantageous in that they are generally simple methods for applying a uniform film in an automated manner suitable for mass production. However, inherent disadvantages thereof include: poor yields for entire surface coating; blocking of certain components by others resulting in noncoated components; the requirement of masking for areas to be free of coating; the expense of work place environmental protection measures for solvents; and splashing of sprayed coatings onto parts not to be coated.

Such prior systems generally include a coating applicator or spray gun mounted on a robot arm, for example, to move the gun in predetermined directions over the printed circuit board for deposition of the coating. One such apparatus is described in U.S. Pat. No. 5,141,165 issued Aug. 15, 1992, entitled "SPRAY GUN WITH FIVE AXIS MOVEMENT" and owned by assignee of the present application. Other related apparatus is described in U.S. Pat. No. 5,188,669, issued Feb. 23, 1993, entitled "CIRCUIT BOARD COATING METHOD AND APPARATUS WITH INVERTING PALLET SHUTTLE", and also owned by assignee of this application. U.S. Pat. Nos. 5,141,165 and 5,188,669, are herewith expressly incorporated herein by reference as background information.

Alternatively, the boards are moved in a predetermined manner beneath the applicator, or the boards and guns are each moved relative to the other in a predetermined manner for coating.

A problem can arise with the apparatus disclosed in the '782 and '818 applications which include an "air assist" feature wherein pressurized air is used to desirably affect the coating material as it is extruded from the discharge slot of the slot nozzle out the discharge outlet of the nozzle. More particularly, with that apparatus and other similar systems using pressurized air to affect the dispensing or dispensed coating material, when the coating material valve is closed, fluid remains in the space between the valve seat and the discharge outlet of the nozzle. While the nozzle remains off, this fluid expands slightly and extrudes from the discharge outlet. Most notably with lower viscosity materials, such as those used to coat printed circuit boards, this extruded material can, by capillary action, wick up into one of the air assist slots of the slot nozzle. When the nozzle is again turned on, the material which has wicked up into the air slot is immediately blown out onto the substrate often in undesirable locations. In addition, extrusion of some of the fluid in this manner can prevent a wide nozzle from starting uniformly across its width thereby resulting in an irregular leading edge to the coating pattern.

One solution to the problem of having the fluid material extrude from the discharge outlet of a nozzle upon shutoff has been proposed in the past in the form of a "snuff back" device. A snuff back device is used to prevent such extrusion by removing excess material from the discharge slot of the nozzle by way of negative pressure created therein immediately upon shutoff of coating material being discharged from the nozzle outlet. Snuff back devices are shown, for example, in U.S. Pat. Nos. 3,315,899; 3,895,748; 3999,691; and 5,078,168, the latter patent being assigned to the assignee of the present invention. In the past, however, the material which has been removed or "snuffed back" from the discharge slot has been discharged from the nozzle immediately upon actuation of the dispenser during the next dispensing cycle. Unfortunately, immediately discharging the material at the beginning of the dispensing cycle can sometimes create undesirable, heavy sections of material at the start of the successive patterns and result in rough or heavy leading edges to the patterns.

Accordingly, it has been an objective of this invention to provide methods and apparatus by which conformal coatings can be applied to circuit boards in a noncontact manner, without masking or splashing, and with sharp, square leading and trailing coating edges with no stringing, A further objective of the invention has been to provide improved methods and apparatus for generating discrete, sharp, square edges while dispensing conformal coatings on irregular substrates such as electronic circuit boards.

A still further objective of the invention has been to eliminate fluid contamination in the air assist slots of a coating dispenser while also preventing snuffed back coating material from adversely affecting the leading edge of a coating pattern.

Another objective of this invention has been to provide a snuff back device in combination with a control which not only prevents dripping or drooling of coating material upon shut-off of the dispenser but discharges this excess coating material after the start of the next coating pattern rather than immediately upon the start of the next coating pattern to improve the definition of the leading edge of the pattern.

SUMMARY OF THE INVENTION

To these ends, a preferred embodiment of the present invention comprises a coating dispenser including a snuff back device for removing a small amount of coating material from the discharge passage of the dispenser upon shut-off thereof. A control is further provided which replaces the material removed from the discharge passage upon a predetermined delay after the start of the next coating pattern. The methods disclosed in the present invention contemplate the discharge of at least part of this excess coating material in the middle of the next coating pattern or, depending on the application, during any segment of the coating pattern after a defined leading edge is created so that the coating material smoothly blends into the coating pattern.

In the preferred embodiment, the snuff back device comprises an air operated piston which communicates with the discharge slot of the coating dispenser and, when retracted, removes a small amount of coating material from the discharge slot. The pressurized air which operates this piston is controlled to retract the piston just after the coating material dispenser is shut-off at the end of a coating pattern and advance the piston to discharge this excess coating material upon a predetermined delay after the start of the next coating pattern. Thus, the air actuated piston is controlled separately from the control of coating material being dispensed from the device. The coating dispenser is preferably constructed generally in accordance with the dispenser disclosed in the '782 and '818 applications while the snuff back device, and more specifically, the control of the snuff back operation is the subject of the present invention.

By way of the present invention, there is thus provided methods and apparatus which form more discrete or sharp leading and trailing edges to coating patterns using coating materials having a wide range of physical characteristics but especially using the low viscosity coating materials applied as films. Further, the present invention prevents dripping, drooling and stringing of coating material upon shut-off of the coating dispenser.

These and other objectives and advantages will become more readily apparent from the following detailed description of a preferred embodiment of the invention taken in conjunction with the accompanying drawings.

BRIEF DESCRIPTION OF THE DRAWINGS

FIG. 1 is a diagrammatic front view of the coating apparatus of the present invention shown in partial cross-section to illustrate inner details of the snuff back device thereof;

FIG. 2 is a side view of the apparatus taken along line 2—2 of FIG. 1 and essentially showing the snuff back manifold and slot nozzle of the preferred embodiment.

DETAILED DESCRIPTION OF THE PREFERRED EMBODIMENT

Figure 3:
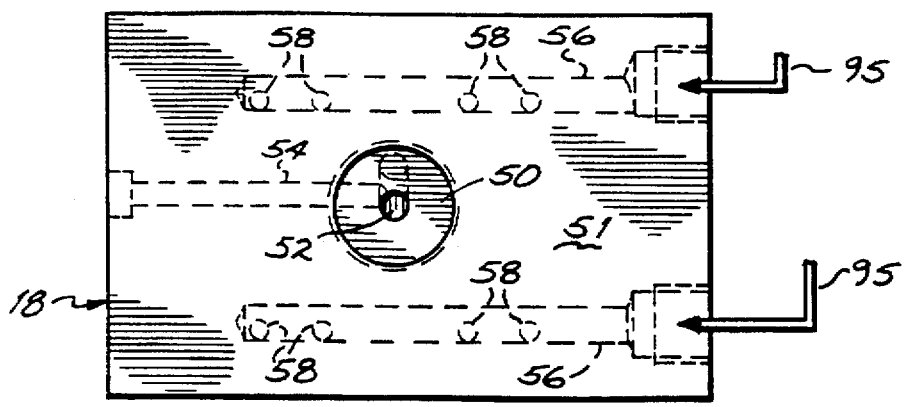
FIG. 3 is a top view of the snuff back manifold taken along line 3—3 of FIG. 1.

Turning first to FIG. 1, coating apparatus is diagrammatically shown and comprises a dispensing system for applying conformal coatings to circuit boards. As will become more apparent by those of ordinary skill upon review of the present specification, the inventive concepts disclosed herein may also be applied to many other fluid dispensing systems.

The coating dispensing apparatus 10 includes a slot nozzle die means 12 constructed generally in accordance with the slot nozzle die means disclosed in the '782 and '818 applications. The slot nozzle die means 12 is rigidly affixed by suitable fasteners to a snuff back device 14 comprising a piston housing 16 and manifold 18 which are likewise rigidly affixed together by suitable fasteners such as screws. Fasteners have been omitted from the drawings for clarity. A piston 20 is disposed within a chamber 22 in the piston housing 16 and is movable back and forth therein while an O-ring 24 maintains the piston 20 is sealing contact with the side walls of the chamber 22. The piston 20 is rigidly secured to a piston rod 26 which, when retracted, supplies a suction force or negative pressure in the coating material passages of the slot nozzle die means 12 as further explained below. A washer 28 is contained between the piston housing 16 and the snuff back manifold 18 and O-rings 30, 32 respectively provide seals between the washer 28 and the piston housing 16 and piston rod 26. A wiper seal 34 surrounds the piston rod 26 within the manifold 18 and is held in place by the washer 28.

At the opposite end of the piston housing 16 a cover 36 is provided and held to the piston housing 16 by threaded fasteners 38. An adjustment screw 40 extends through the cover 36 and into the piston chamber 22 to provide an adjustable stop mechanism for the piston 20. A lock nut 42 is provided to lock the adjustment screw 40 in a desired position. The adjustment screw 40 abuts a head portion 44 of the piston rod 26 when the piston 20 is retracted. As will become more apparent, this provides an adjustment for the amount of coating material being snuffed back or removed from the coating material passages away from the discharge outlet of the slot nozzle die means 12. Air passageways 46, 48 extend from an outside surface of the piston housing 16 to the chamber 22 for allowing the introduction of pressurized air used to actuate the piston 20 back and forth between the left portion 23 of chamber 22 and the right portion 25 of chamber 22 as viewed in FIG. 1.

Referring now to FIGS. 1–3, the snuff back manifold 18 provides an interface for allowing snuff back, liquid dispensing, and air assist operations to occur in the slot nozzle die means 12. In this regard, the snuff back manifold 18 includes an upper coating material input 50 extending into the manifold 18 from an upper surface 51 thereof and leading to a passageway 52 which extends to a lower surface 53 of the manifold 18. The manifold 18 further includes a horizontal snuff back passage 54 extending from an outer surface of the manifold 18 and communicating with coating material discharge passage 52. Passage 54 slidingly receives piston rod 26 such that a vacuum or negative pressure is created in passages 52 and 54 when piston rod 26 is retracted as shown in FIG. 1.

As best shown in FIGS. 2 and 3, the manifold 18 includes two horizontal air passages 56 extending into the manifold 18 from an outer surface thereof and including a plurality of vertically extending passages 58 for providing an air assist function as explained below and as more greatly detailed in the '782 and '818 applications.

As shown in FIGS. 1 and 2, the die means 12 comprises two die halves 60, 62 and two air blocks 64, 66. Each die block or half 60, 62 includes a downwardly depending projection 68, 70. The die halves 60, 62 define between them an extrusion slot or discharge passageway 72 leading to an extrusion or discharge outlet 74.

Die half 62 includes a coating material passageway 76 for receiving coating material and conducting the material to a "coat hanger" portion 78 of die half 62, details of which are better disclosed in the '782 and '818 applications. FIGS. 2 and 3 further show that the die halves 60, 62 are each provided with air passageways 80 extending from upper surfaces of each respective die half 60, 62 to lower surfaces thereof. O-ring seals (not shown) are provided at the upper and lower ends thereof to enable a sealing connection to be made between all respectively communicating passages 58, 82 and 86. Die half 60 includes four such air passages 80 each communicating with a respective air passage 58 in the snuff back manifold 18. Only one of the four passages 58 and one of the four passages 80 is shown in FIG. 1, the others being omitted. Die half 62 likewise includes four such air passages 80 communicating at the upper surface thereof with four respective air passages 58, one of which is shown in FIG. 2. As further shown in FIG. 2, the air blocks 64, 66 each include four respective air passages 86 communicating between the lower ends of the respective air passages 80 in die halves 60, 62 and a pair of angled air assist slots 88. It will be appreciated that four air passages 86 are provided in each of the respective air blocks 64, 66 and respectively communicate with the four air passages 80 contained in each of the die halves 60, 62.

Referring now to the upper portion of FIG. 1, a control 92 is operatively connected to valves 94 (only one of which is shown in the drawings) for controlling the introduction of pressurized air into passages 56 by way of separate air lines 95 (FIG. 3) in order to pressurize those passages and the previously described downstream air passages 58, 80 and 86. At the same time, the control 92 is operatively connected to a coating material valve 96 for controlling the supply of coating material to input 50 and ultimately to the internal "coat hanger" region 78 and outlet slot 74 of die means 12 (FIG. 2). Each valve 94 is air operated and connected to a pressurized air source 98. An air heater (not shown) could be provided between source 98 and valve 94 to heat the air if desired. The coating material valve 96 can be any suitable coating material valve which can be selectively controlled to initiate and to cut-off the flow of coating material to the die means 12. One such suitable valve, disclosed in the '782 and '818 applications, is balanced valve Model No. EP51 produced by Nordson Corporation of Westlake, Ohio.

FIG. 1 further illustrates diagrammatically the various control inputs to the valves 94 and 96. In this regard, control 92 is connected to a control air supply 102 for supplying control air to the valves 94 and 96. A source of pressurized coating material 104 is connected to the valve 96. The control 92 is further connected to solenoid control valves 106 as is the control air supply 102 for supplying control air through solenoid control valves 106 to open and close the valve 96. The air operated valves 94 may be comprised of any suitable valves but are preferably valves manufactured and distributed by Nordson Corporation, under part number 120,999 and as detailed in the '782 and '818 applications. Any suitable apparatus can be utilized for supplying conformal coating material to valve 96. For example, such apparatus may comprise any suitable pump, pressure pot or other device. The control 92 could be a PC which operates the valves 94, 96, 102, 108, 110 and 116, as further described below, in response to pattern information for the pattern of coating material to be applied to the board.

One particular form of apparatus 104 designed for supplying hot melt type coating material to valve 96 is the Model HM640, manufactured by Nordson Corporation of Westlake, Ohio. While any suitable form of control 92 can be used, a preferable controller for hot melt type coating materials comprises a PC-44 pattern controller, manufactured by Nordson Corporation, of Westlake, Ohio and which is an updated and enhanced controller from the PC-10 controller disclosed in the '782 and '818 applications. The PC-44 pattern control 92 is operational to initiate and to stop the generation of air into air passages 56 of snuff back manifold 18, either simultaneously or independently, and also to initiate and to stop the coating material flowing through valve 96 so as to intermittently provide coating material to the input 50 independently and at preselected times with respect to the provision of pressurized, heated air to passages 56, in accordance with what is described below. The PC-44 control 92 is further operational to initiate and to stop the generation of air into passages 46 and 48 of the snuff back piston housing 16 in an independent manner so as to control the extension and retraction of the piston 20 and thereby control the timing of the snuff back operation in accordance with the description below.

Referring now to FIG. 1 in connection with the diagrammatically illustrated control components used to operate the snuff back device 14, a pair of valves 108, 110 are connected to air passages 46, 48 to independently supply air to portions 23, 25 of chamber 22. Valves 108, 110 are preferably three or four way valves while valve 94 is preferably a two way valve. Each of the air or pneumatically operated valves 108, 110 is connected to a respective pressurized air source 112, 114. Each valve 108, 110 is also connected to a control air supply 116 which is operatively connected to the control 92. The control 92 selectively causes the control air 116 to operate either valve 108 or valve 110 depending on whether the piston 20 is to be extended or retracted during a coating operation. As valves 108, 110 are three or four way valves it will be appreciated that they may also be controlled to alternatingly vent portions 23, 25 of chamber 22. For example, during movement of piston 20 to the right as viewed in FIG. 1, pressurized air 112 is supplied to chamber portion 23 by valve 108 and is vented from chamber portion 25 by way of valve 110. During movement of piston 20 to the left, air is supplied by way of valve 110 and vented by way of valve 108.

Turning now to the use of the apparatus 10 in the application of coatings to substrates, it will be appreciated that the apparatus 10 is capable of impinging air from air assist slots 88 on each side of the coating material extruding from the extrusion slot outlet 74. The impinging air engages and carries the expanse of coating material onto the circuit boards or other substrates in the form of a solid impervious film. The control 92 is operative to start and stop the application of air to the extruded coating material at different times and/or intervals compared to the starting and stopping of the delivery of coating material to the extrusion outlet 74. The control of air within slots 88 as well as the control of coating material being directed through the extrusion outlet 74 do not form part of the present invention but, rather, are fully described in the '782 and '818 applications incorporated herein. The remaining description of the operation of apparatus 10 will thus be mainly directed at the control system and method for operating the snuff back device 14.

During the application of a coating onto a substrate, the control 92 operates valves 94 and 96 to respectively cause pressurized air to be directed through passages 56 of the snuff back manifold 18 and cause coating material to flow into input 50 of manifold 18, for example, as described in the '782 and '818 applications. At the end of the coating run, valve 96 is actuated to stop the coating material from extruding through slot outlet 74. After, for example, a 20 ms delay, the pressurized air flowing through slots 88 is shut off by valves 94 which are closed by control 92. At the same time, or substantially simultaneously with the closing of valves 94, the piston 20 is retracted within chamber 22 of the snuff back piston housing 16. In this regard, control 92 causes valve 110 to pressurize section 25 of the chamber 22. This retracts the piston rod 26 within passage 54 to withdraw a predetermined amount of coating material back into the extrusion slot 72 and away from slot outlet 74. This is accomplished by drawing coating material into passage 54 from passage 56. This prevents dripping and drooling of coating material after valve 96 has been closed at the end of a coating run. This also prevents excess coating material from extruding from discharge outlet 74 upon shut-off and wicking up into one or both of the air assist slots 88 and subsequently being expelled by pressurized air within slots 88 during the next coating run.

The adjustment screw 40 is used to adjust the length of the piston stroke such that the amount of coating material withdrawn into passage 54 may be varied according to the needs of the application as well as the physical characteristics, such as the viscosity, of the coating material. Such adjustment is desirable since, if too much coating material is withdrawn into passage 54 from the discharge slot 72 and/or passage 76 in the die means 12, the coating material will have to fill too much of a void in passages 72, 76 of the die means 12 at the start of the coating operation and thus the leading edge may be either light, splotchy, or completely absent from the desired location on the next coating run. On the other hand, if too little material is removed into the passage 54 due to insufficient retraction of piston rod 26, then the problems of dripping, drooling and the wicking mentioned above are possible.

At the start of the next coating run, instead of immediately expelling coating material from passage 54, valve 96 is opened to cause liquid coating material to flow through discharge outlet 74 and valves 94 are opened to cause pressurized air to be directed through air assist slots 88, for example, in the manner outlined in the '782 and '818 applications. Then, after a predetermined delay which may, for example, be 10 ms in duration, the snuff back device 14 is activated by the control 92 to expel the removed material from passage 54. To this end, control 92 causes valve 108 to open and pressurized air is thereby directed through passage 46 and into portion 23 of chamber 22 thus forcing piston 20 to the right as viewed in FIG. 1. Piston rod 26 thereby expels the withdrawn coating material from passage 54 into passages 52 and 76 and then into coating hanger portion 78 and slot 72 so that is discharged from outlet 74 at a location which is spaced inwardly from the leading edge of the discrete, conformal coating. Since this excess or removed coating material is expelled inwardly from the leading edge of the applied coating, a sharper leading edge is created with little or no spattering of coating material. The excess or removed coating material expelled after a delay following the start of the coating run is easily blended into the coating in a middle portion thereof so that a uniform pattern with good edge definition is produced.

It will be appreciated that while a preferred embodiment of the invention has been described above, those of ordinary skill in the art will readily appreciate many modifications and substitutions of the particulars disclosed herein. For example, although one type of snuff back device has been described above, many other types of snuff back devices may be substituted therefor without departing from the scope of the invention. Likewise, many types of coating apparatus may be substituted for the specific coating apparatus disclosed herein without departing from the inventive concepts disclosed herein.

These and other modifications and advantages of the invention will become readily apparent to those of ordinary skill in the art without departing from the scope of the invention and applicants intend to be bound only by the claims appended hereto.

I claim:

1. A method of dispensing coatings from a coating dispenser, the method comprising the steps of:

discharging a first discrete pattern of coating material from a discharge outlet of said coating dispenser, said coating dispenser having a discharge passage communicating with the discharge outlet and a snuff back passage communicating with the discharge passage;

stopping the discharge of said coating material;

after said stopping, then activating a snuff back device to withdraw coating material into the snuff back passage of said coating apparatus and away from said discharge outlet;

thereafter discharging a second discrete pattern of coating material from said discharge passage and said discharge outlet; and, upon a delay after discharging coating material into said second discrete pattern, reactivating said snuff back device and expelling at least a part of said coating material from said snuff back passage as part of said second discrete pattern of coating material.

2. The method of claim 2 wherein said first and second discrete patterns are applied to electronic circuit boards.

3. The method of claim 1 wherein said coating apparatus further includes air assist passages located proximate said discharge outlet, wherein the method further comprises directing pressurized air through said air assist passages while discharging said first discrete pattern and turning off said pressurized air after stopping the discharge of said coating material.

4. The method of claim 3 wherein the steps of withdrawing said coating material into said snuff back passage and the step of turning off said pressurized air occur substantially simultaneously.

5. The method of claim 4 wherein said first and second discrete patterns are conformal coatings applied to circuit boards.

6. The method of claim 1 wherein said first and second discrete patterns are conformal coatings applied to circuit boards.

7. A method of dispensing conformal coatings from coating apparatus and onto substrates, the method comprising the steps of:

dispensing a first amount of conformal coating through a discharge of a nozzle, said discharge slot having an outlet;

depositing said first amount of conformal coating on said substrate to form a first coating pattern thereon;

stopping the dispensing of said conformal coating;

after said stopping, then activating a snuff back device to withdraw conformal coating into a snuff back passage communicating with the discharge passage and away from said outer;

thereafter dispensing a second amount of conformal coating through said discharge and from said outlet; and after activating said coating apparatus to begin dispensing said second amount of conformal coating, reactivating the snuff coating device and discharging at least a part of the conformal coating in said snuff back passage into the discharge passage.

8. The method of claim 7 wherein at least a part of said coating material which is discharged from said snuff back passage forms a part of said second amount of conformal coating.

9. The method of claim 7 wherein said coating apparatus further includes an air assist slot located on each side of said slot outlet, wherein the method further comprises directing pressurized air through said air assist slots while discharging said first discrete coating and turning off said pressurized air after stopping the discharge of said coating material.

10. The method of claim 9 wherein the steps of withdrawing said coating material into said snuff back passage and the step of turning off said pressurized air occur substantially simultaneously.

11. Coating apparatus comprising:

a pressurized coating supply;

a dispensing device including a discharge passage having an outlet and a snuff back passage communicating with the discharge passage, said discharge passage being operatively connected to said coating supply by way of a valve connected between said dispensing device and said supply, said valve operative to selectively allow coating material to flow from said supply into said discharge passage;

a snuff back device operatively connected to said dispensing device and including means for selectively withdrawing an amount of coating material into said snuff back passage and away from said outlet once said valve is closed; and, control means for actuating said snuff back device to expel at least a part of said amount of coating material from said snuff back passage after said valve has been actuated to allow said coating material to flow into said discharge passage.

12. The apparatus of claim 11 wherein said means for selectively withdrawing comprises means for selectively producing a vacuum in said snuff back passage.

13. The apparatus of claim 12 wherein said means for selectively producing a vacuum comprises a member disposed in said snuff back passage which is withdrawn along said snuff back passage to produce a vacuum in said snuff back passage.

14. The apparatus of claim 13 wherein said member is engageable by an adjustable stop which limits the travel of said member along said snuff back passage.

15. The apparatus of claim 13 wherein a piston is connected to said member, said piston being reciprocatively disposed in a chamber by means of air pressure selectively introduced on opposite sides of said piston.

16. The apparatus of claim 11 further comprising a manifold connected between said valve and said nozzle, said snuff back passage being formed in said manifold.

17. The apparatus of claim 16 further comprising a piston housing secured to said manifold, said piston housing having a chamber and a piston disposed for reciprocating movement in said chamber, a member being attached to said piston and disposed in said snuff back passage, and still further comprising means for reciprocating said piston in said chamber to reciprocate said member within said snuff back passage, wherein said piston, said chamber, said member and said reciprocating means comprise said means for selectively withdrawing an amount of coating material into said snuff back passage, and wherein said control means operates said reciprocating means.

18. The apparatus of claim 17 further comprising an adjustable stop which limits the travel of said piston in said chamber and thereby limits the travel of said member in said snuff back passage.

* * * * *

UNITED STATES PATENT AND TRADEMARK OFFICE
CERTIFICATE OF CORRECTION

PATENT NO. : 5,733,597
DATED : March 31, 1998
INVENTOR(S) : James W. Schmitkons et al.

It is certified that error appears in the above-indentified patent and that said Letters Patent is hereby corrected as shown below:

Column 8, line 32, "2" should be --1--.

Column 8, line 55, after the first occurrence of "discharge" insert --passage--.

Column 8, line 55, "slot" should be --passage--.

Column 8, line 63, "outer" should be --outlet--.

Column 8, line 65, after "discharge" insert --passage--.

Column 9, line 1, "coating" should be --back--.

Signed and Sealed this

Seventh Day of July, 1998

Attest:

BRUCE LEHMAN

*Attesting Officer*  *Commissioner of Patents and Trademarks*